United States Patent
Lin et al.

(10) Patent No.: US 6,947,294 B2
(45) Date of Patent: Sep. 20, 2005

(54) EMI-ATTENUATING AIR VENTILATION PANEL

(75) Inventors: Yun Hsu Lin, San Jose, CA (US); Shang Tsang Yeh, Tu-Chen (TW); Wei Li, Shenzhen (CN); XiaoWei Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/618,399

(22) Filed: Jul. 11, 2003

(65) Prior Publication Data

US 2004/0233654 A1 Nov. 25, 2004

(30) Foreign Application Priority Data

May 23, 2003  (TW) .......................................... 92209563

(51) Int. Cl.[7] .............................. H05K 9/00; H05K 5/00; H01J 15/00; H01J 5/00; H02G 3/08
(52) U.S. Cl. .......................... 361/818; 361/816; 174/50; 174/35 R
(58) Field of Search ................................ 361/212, 220, 361/728, 752, 796, 800, 816, 818; 174/35 R, 35 GC, 50, 51, 52.1; 211/41.17; 312/223.2

(56) References Cited

U.S. PATENT DOCUMENTS

| 5,401,914 | A | | 3/1995 | Curran et al. |
| 5,744,213 | A | * | 4/1998 | Nelson ....................... 428/131 |
| 5,928,076 | A | | 7/1999 | Clements et al. |
| 6,418,020 | B1 | * | 7/2002 | Lin ............................ 361/703 |
| 6,426,459 | B1 | | 7/2002 | Mitchell |
| 6,446,709 | B1 | * | 9/2002 | Huang ....................... 165/80.3 |

* cited by examiner

Primary Examiner—Phuong T. Vu
(74) Attorney, Agent, or Firm—Wei Te Chung

(57) ABSTRACT

An EMI-attenuating air ventilation panel (10, 30) for an electronic device enclosure (100) in accordance with present invention includes an electronically conductive base plate (16) and a plurality of vents (12, 14, 32) defined in the base plate for forming a vents array. Each vent has extruded sidewalls (120, 140, 31) extending from sides therein. In use, the EMI from electronic components within the electronic device enclosure is efficiently attenuated by the sidewalls.

4 Claims, 5 Drawing Sheets

EMI-ATTENUATING AIR VENTILATION PANEL

BACKGROUND OF THE INVENTION

1. Field of the Invention

The present invention relates to an electromagnetic interference (EMI) attenuating ventilation panel, and particularly to an EMI-attenuating ventilation panel which has a high density of openings.

2. Related Art

With the ongoing development of electronics technology, many computer components operate at higher and higher frequencies while becoming smaller and smaller. More heat generated by higher frequency components requires more cooling. In addition, higher frequency components generate more electromagnetic interference (EMI). If the EMI is not properly shielded, it can disrupt operation of other electronic equipment. EMI radiation typically escapes through air ventilation holes used for cooling purposes. Thus electronic equipment manufacturers often face a trade-off between cooling and shielding of EMI when designing new equipment.

By using wave guide theory to improve the shape and structure of ventilation holes, EMI can be efficiently attenuated. Conventional means for attenuating EMI that escapes though a ventilation hole include reducing the diameter of the ventilation hole, increasing a thickness of the ventilation panel, or attaching an extending pipe at the ventilation hole. A conventional EMI shielding vent panel is disclosed in U.S. Pat. No. 6,426,459. The vent panel comprises an electrically-conductive frame member having a generally U-shaped or C-shaped profile including end wall portions and a pair of side wall portions integral with the end wall portions, and an electrically-conductive porous shielding member that is supported by the frame member. However, the vent panel requires additional material and adds to costs.

Thus, a EMI-attenuating ventilation panel which is simple and cost-efficient is desired.

SUMMARY OF THE INVENTION

Accordingly, an object of the present invention is to provide an EMI-attenuating ventilation panel which has a high density of openings and is cost-efficient.

To achieve the above-mentioned object, an EMI-attenuating ventilation panel in accordance with a preferred embodiment of the present invention comprises an electronically conductive base plate, a multiplicity of rectangular first vents and second vents alternatively defined in the base plate. Each of the first vents comprises two extruded first sidewalls extending from two opposite sidewalls therein. Each of the second vents comprises two extruded second sidewalls extending from two opposite sidewalls therein perpendicular to said first sidewalls for forming a vents array. Consequently each of the first and second vents in an inner portion the array is surrounded by the first sidewalls and second sidewalls.

An EMI-attenuating ventilation panel of an alternative embodiment of present invention comprises a base plate and a plurality of vents defined therein. Each vent is substantially a frustum of square pyramid. The vent comprises four slanted sidewalls extending inwardly toward each other, thereby defining a smaller upper opening therebetween.

Other objects, advantages and novel features of the present invention will be drawn from the following detailed description of the preferred embodiments of the present invention with the attached drawings, in which:

DESCRIPTION OF THE PREFERRED EMBODIMENT

Figure 1:
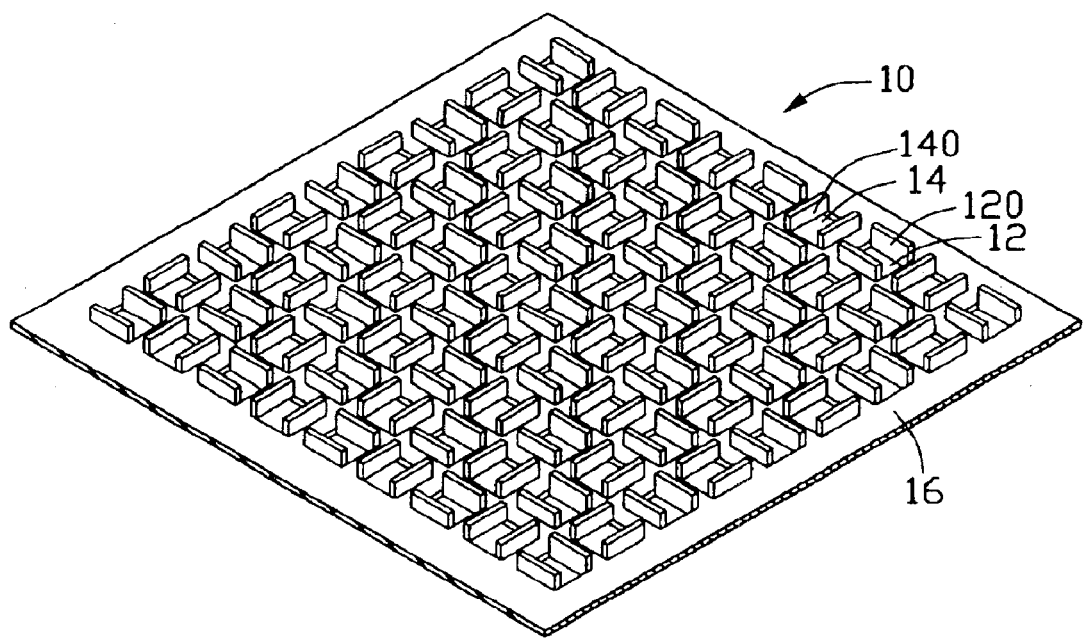
FIG. 1 is an isometric view of an EMI-attenuating ventilation panel in accordance with the preferred embodiment of the present invention.
Figure 2:
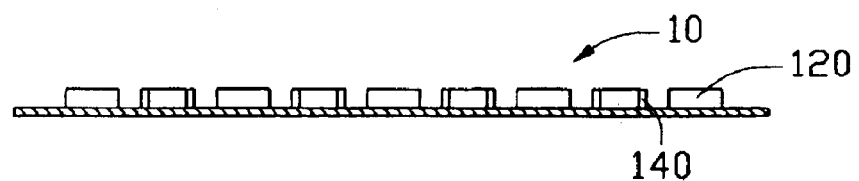
FIG. 2 is a side elevation view of FIG. 1.

Referring to FIGS. 1 and 2, an EMI-attenuating ventilation panel 10 in accordance with the preferred embodiment of the present invention comprises an electronically conductive base plate 16 and a multiplicity of rectangular first vents 12 and second vents 14 defined in the base plate 16.

Each first vent 12 comprises a pair of first sidewalls 120 stamped from the base plate 16 and being opposite from each other. Each second vent 14 comprises a pair of second sidewalls 140 stamped from the base plate 16 and being opposite from each other. The first sidewalls 120 are perpendicular to the second sidewalls 140. The first and second vents 12, 14 have corresponding same dimensions. The first vents 12 and the second vents 14 are alternately arranged on the base plate 16 to form a vent array. In general, each first vent 12 is surrounded on four sides by four second vents 14 respectively, and each second vent 14 is surrounded on four sides by four first vents 120 respectively. Since the first sidewalls 120 and the second sidewall 140 are stamped from the base plate 16, heights of the first and second sidewalls 120, 140 are not limited by a thickness of the base plate 16.

Figure 3:
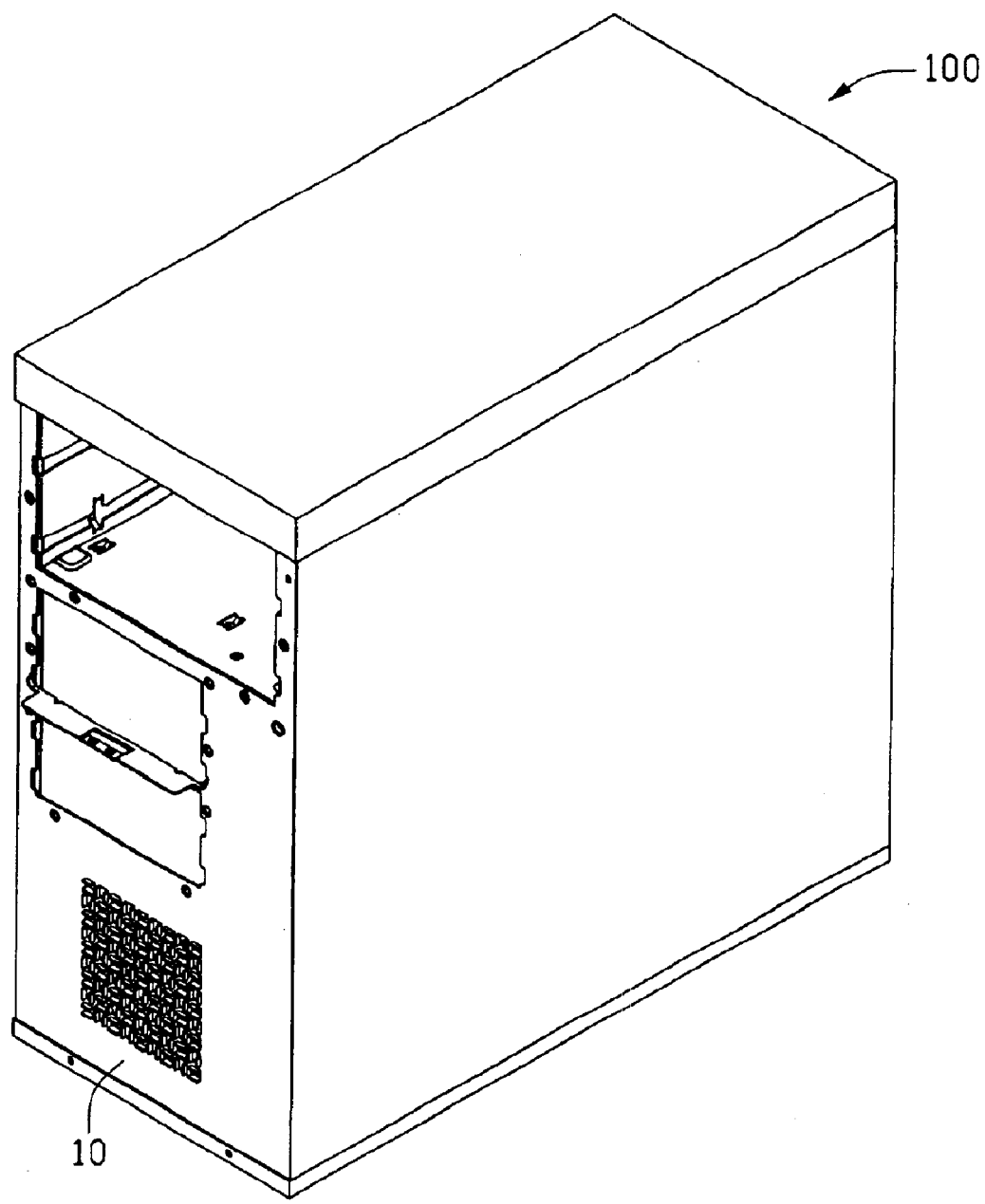
FIG. 3 is an isometric view of a computer enclosure incorporating the EMI-attenuating ventilation panel of FIG. 1.

Referring to FIG. 3, in use, the panel 10 is used as part of a front plate of a computer enclosure 100. In terms of waveguide theory:

$$SE \text{ (shielding effect)} = 30 \, (d/g) \text{ decibels}$$

wherein "d" means a depth of a vent; and "g" means a "gap" of the vent.

The SE is directly proportional to the depth of the vent, and inversely proportional to the gap of the vent. Consequently, in the preferred embodiment, electromagnetic emission emanating from electronic components within the computer enclosure 100 is efficiently attenuated by the first and second sidewalls 120, 140. For a given area of the base plate 16, a combined area of the openings of the rectangular first and second vents 12, 14 is greater than a combined area of circular openings of conventional vents. As a result, the computer enclosure 100 is both efficiently cooled and EMI-attenuated.

Figure 4:
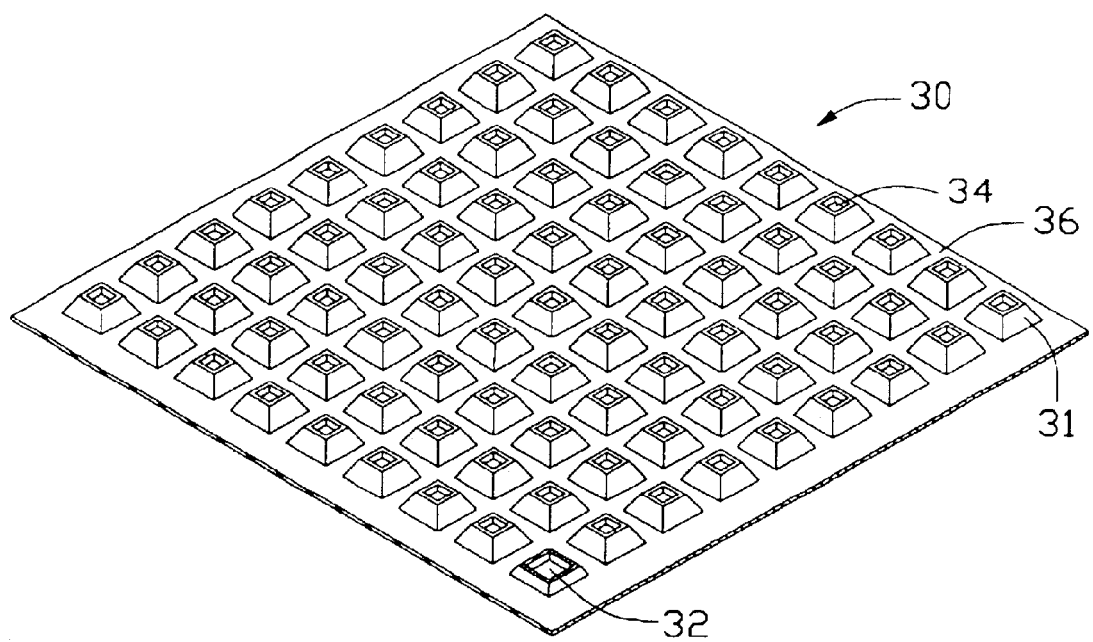
FIG. 4 is an isometric view of an EMI-attenuating ventilation panel in accordance with the alternative embodiment of the present invention.

Referring to FIG. 4, an EMI-attenuating ventilation panel 30 in accordance with the alternative embodiment of the present invention comprises an electronically conductive base plate 36 and a plurality of vents 32 defined therein. Each vent 32 is substantially a frustum of a square pyramid. The vent 32 comprises four slanted sidewalls 31 extending inwardly toward each other, thereby defining a smaller upper opening 34 therebetween.

Figure 5:
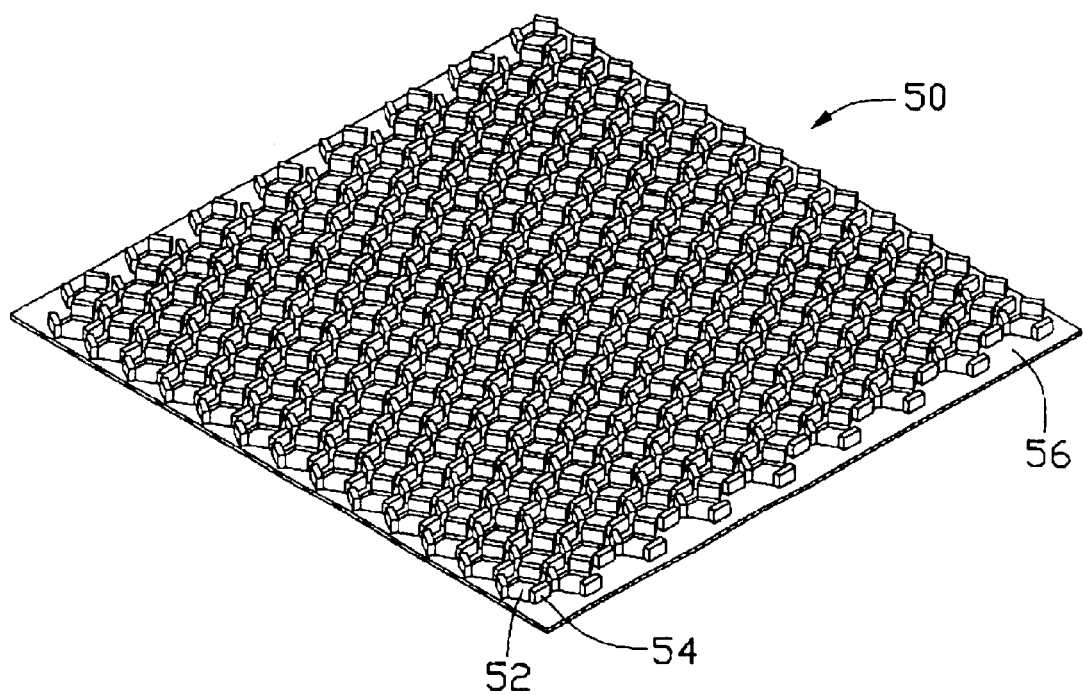
FIG. 5 is an isometric view of an EMI-attenuating ventilation panel in accordance with a third embodiment of the present invention.

Referring to FIG. 5, an EMI-attenuating ventilation panel 50 in accordance with the third embodiment of the present invention comprises an electronically conductive base plate 56 and a plurality of hexagon vents 52 defined therein. Three spaced sidewalls 54 are stamped from the base plate 56 adjacent three edges of each hexagon vent 52. In general, each hexagon vent 52 is surrounded on spaced three sides by three sidewalls 54 formed therein and surrounded on the other three sides by three sidewalls 54 formed in three adjacent vents 52, respectively. In the third embodiment, the sidewalls 54 are stamped from the base plate 56. So, a height of the sidewall 54 is not limited by a thickness of the base plate 16.

As with the first and second vents 12, 14 of the preferred embodiment of the present invention, the EMI-attenuating vents 32 of the alternative embodiment of the present invention, and the hexagon vents 52 of the third embodiment of the present invention provide superior shielding for radiated EMI when compared to the circular openings of conventional "flat" vents. For a given area of the base plate 36, a combined area of openings of the square vents 32 is greater than a combined area of the circular openings of conventional vents.

Figure 6:
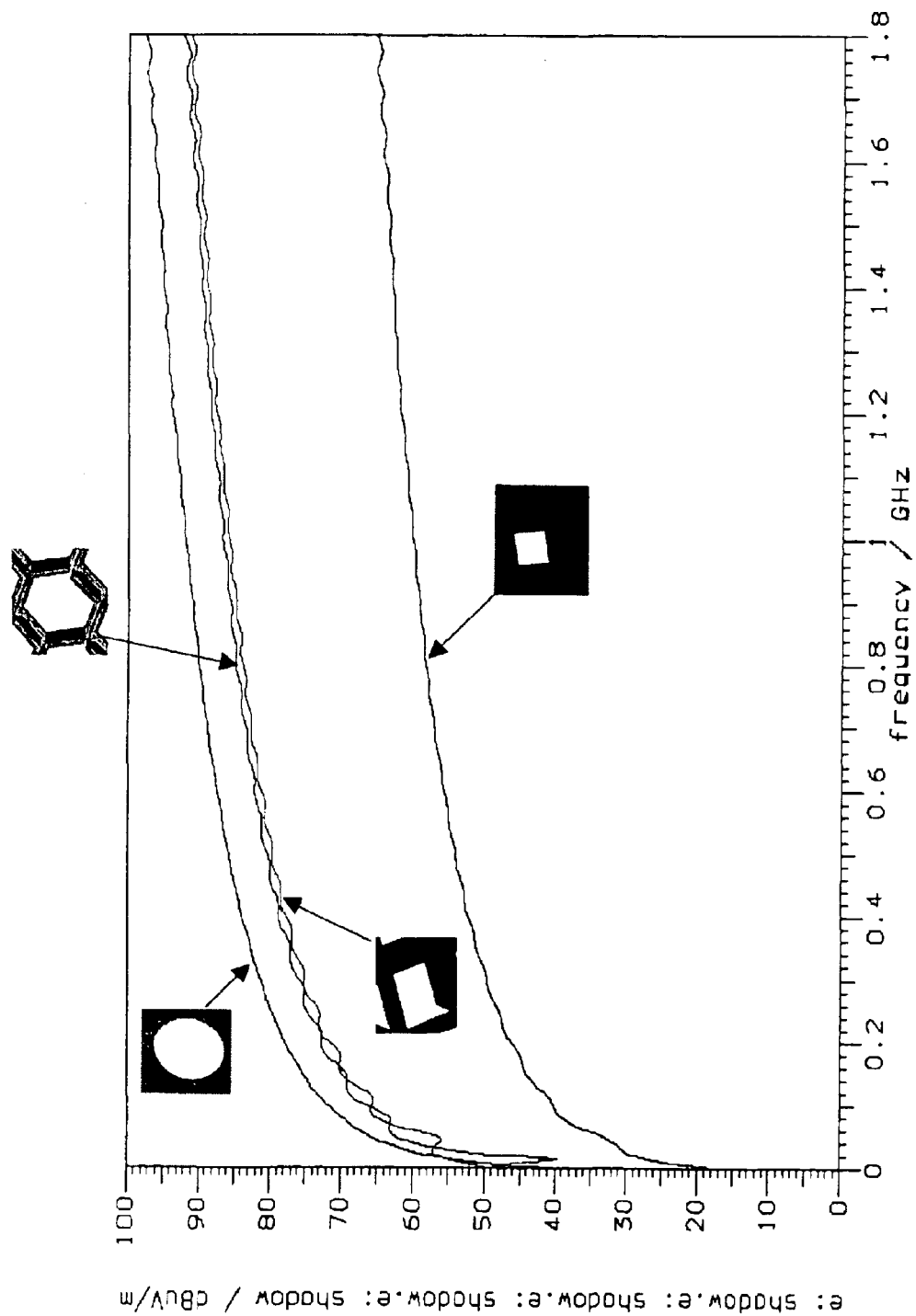
FIG. 6 is a graph showing the relation between electromagnetic emission through each of three different kinds of vents and the frequency of the electromagnetic emission.

Extensive tests have established the superiority of the present invention. Test results are shown in FIG. 6. The four curves of the graph of FIG. 6 respectively correspond to: a conventional flat circular vent; the first 12 or second vent 14 of the panel 10 of the preferred embodiment, the vent 32 of the panel 30 of the alternative embodiment, and the vent 52 of the panel 50 of the third embodiment, of which the area is the same. The graph shows the relation between electromagnetic emission through each said vent and the frequency of the electromagnetic emission. The results show that all the first/second vent 12, 14 of the panel 10, the vent 32 of the panel 30 and the vent 52 of the panel 50 offer superior shielding compared with the conventional flat circular vent at all measured emission frequencies.

From the foregoing it will be appreciated that the EMI-attenuating air ventilation panels 10, 30, 50 of the present invention provide significant advantages in comparison with the conventional art. The invention provides a cost-efficient and high-density solution for two demanding requirements of most electronic and electrical systems: cooling and EMI attenuation. The protruded first, second, slanted sidewalls and sidewall 120, 140, 31, 52 of the panels 10, 30, 50 provide effective attenuation of electromagnetic emission, and the high density of the openings of the panels 10, 30, 50 allow more airflow compared with the conventional circular openings. Moreover, the simplicity of the vents 12, 14, 32, 52 of the present invention lowers a weight and a cost of the panels 10, 30, 50 compared with conventional EMI solutions. This is because the panels 10, 30, 50 have high densities of openings, and do not require attachment of extending pipes or other structures that would otherwise increase a weight and a thickness of the panels 10, 30, 50.

It is understood that as mentioned before the square vents or the hexagon vents can be arranged more densely than the circular vents in the panel. Therefore, from the ventilation consideration, it may be desired to provide polygonal vents in the panel. While on the other hand, it is easier for the circular vents to form the side walls via an extrusion/drawing procedure, as shown in U.S. Pat. No. 5,928,076, than other shaped vents, even though the height of such side walls is limited by the thickness of the panel. The invention discloses the stamping/bending arrangement to form such side walls, which is easy, inexpensive and without restrictions of the height due to limitations of the thickness of the panel. Moreover, for increasing the height of such side walls, each subject four sided square vent may only form two opposite side walls on two opposite sides to obtain the shielding effect along the first direction defined by those two side walls while still maintaining the shielding effect along a second direction perpendicular to the first direction by two other side walls stamped/bent from the other two neighboring square vents by other two opposite sides of the subject square vent. It is because the square vents can be densely arranged with one another, and the neighboring vents can share the same side walls for shielding effect. Similarly, this shielding sharing may be applied to the hexagon or other polygonal vents. From another viewpoint, the instant invention also discloses in FIG. 4 the non-circular vents (for achievement of high density in the panel) with side walls via the extrusion/drawing procedure, instead of the stamping/bending method, under a condition that the such side walls are convergent, rather than straight, away from the panel.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An EMI-attenuating ventilation panel for an electronic device enclosure, comprising:

an electronically conductive base plate; and a plurality of first vents and second vents alternatively defined in the base plate, each of the first vents having two first sidewalls integrally extending from the base plate on opposite sides thereof, each of the second vents having two second sidewalls integrally extending from the base plate on opposite sides thereof and perpendicular to said first sidewalls, the first and second vents cooperatively forming a vent array;

wherein each of the first and second vents in an inner portion of the array is surrounded by corresponding first sidewalls and second sidewalls.

2. The EMI-attenuating air ventilation panel as claimed in claim 1, wherein both the first sidewalls and the second sidewalls are perpendicular to the base plate.

3. An EMI-attenuating air ventilation panel for an electronic device enclosure, comprising:

an electronically conductive base plate; and a plurality of polygonal vents defined in the base plate, each of the vents having a plurality of sidewalls upwardly extending from the base plate on respective sides thereof; wherein for each of said polygonal vents, not all the sides have the corresponding side walls extending therefrom, respectively;

wherein for each of said polygonal vents, the corresponding side walls are alternately arranged for at least every two adjacent sides thereof.

4. An EMI-attenuating air ventilation panel for an electronic device enclosure, comprising:

an electronically conductive base plate; and a plurality of polygonal vents defined in the base plate, each of the vents having a plurality of sidewalls upwardly extending from the base plate on respective sides thereof; wherein for each of said polygonal vents not all the sides have the corresponding side walls extending therefrom, respectively;

wherein each of said polygonal vents, is surrounded by not only the side walls extending from the corresponding sides thereof, but also the corresponding side walls of the neighboring vents which are located beside the sides having no side walls extending therefrom to achieve EMI shielding.

* * * * *